United States Patent
Sekikawa et al.

(10) Patent No.: US 6,690,070 B2
(45) Date of Patent: Feb. 10, 2004

(54) INSULATED GATE SEMICONDUCTOR DEVICE AND ITS MANUFACTURING METHOD

(75) Inventors: Nobuyuki Sekikawa, Ashikagai (JP); Masaaki Momen, Ojiya (JP); Wataru Andoh, Kamo (JP); Koichi Hirata, Sanjyo (JP)

(73) Assignee: Sanyo Electric Co., Ltd., Osaka (JP)

( * ) Notice: Subject to any disclaimer, the term of this patent is extended or adjusted under 35 U.S.C. 154(b) by 108 days.

(21) Appl. No.: 09/925,628

(22) Filed: Aug. 10, 2001

(65) Prior Publication Data

US 2002/0038895 A1 Apr. 4, 2002

(30) Foreign Application Priority Data

Aug. 10, 2000 (JP) ........................................ 2000-242617

(51) Int. Cl.$^7$ .................... H01L 31/119; H01L 21/3205
(52) U.S. Cl. ........................ 257/368; 257/383; 257/384; 257/385; 257/387; 438/592
(58) Field of Search .................. 257/368, 383, 257/384, 385, 387; 438/592, 649, 583, 651

(56) References Cited

U.S. PATENT DOCUMENTS

| | | | | |
|---|---|---|---|---|
| 5,017,979 A | * | 5/1991 | Fujii et al. .................. 357/23.5 |
| 5,168,072 A | * | 12/1992 | Moslehi ........................ 437/41 |
| 5,200,637 A | * | 4/1993 | Matsuo et al. ............... 257/368 |
| 5,346,587 A | * | 9/1994 | Doan et al. .................. 156/657 |
| 5,397,909 A | * | 3/1995 | Moslehi ........................ 257/383 |
| 5,753,954 A | * | 5/1998 | Chi et al. .................... 257/318 |
| 5,882,994 A | * | 3/1999 | Araki et al. ................. 438/593 |
| 5,897,365 A | * | 4/1999 | Matsubara .................. 438/592 |
| 6,093,950 A | * | 7/2000 | Kuroda ........................ 257/369 |
| 6,188,113 B1 | * | 2/2001 | Derhocobian et al. ...... 257/399 |

* cited by examiner

*Primary Examiner*—Wael Fahmy
*Assistant Examiner*—Shrinivas H. Rao
(74) *Attorney, Agent, or Firm*—Morrison & Foerster LLP

(57) ABSTRACT

A gate electrode includes a first polysilicon film remaining on a first oxide film, a part of a second polysilicon layer 8 superimposed on the polysilicon layer, and a part of the second polysilicon layer partially extending over second gate oxide films. Thus, the thickness of the gate electrode on the first gate oxide film is the same as that of the gate electrode of the prior art, but the film thickness t2 of the gate electrode 10 on the second gate oxide films 6A and 6B is thinner than the thickness t1 of the prior art. Therefore, the height gap h2 between the gate electrode 10 and the N + type source layer 11 and the height gap h2 between the gate electrode 10 and the N + type drain layer 12 become smaller compared to those of prior art, leading to the improved flatness of the interlayer oxide film 13.

7 Claims, 3 Drawing Sheets

INSULATED GATE SEMICONDUCTOR DEVICE AND ITS MANUFACTURING METHOD

BACKGROUND OF THE INVENTION

1. Technical Field of the Invention

This invention relates to an insulated gate semiconductor device with high voltage structure and its manufacturing method, especially to a technology to improve the breakdown voltage between a gate and a source as well as the breakdown voltage between a gate and a drain.

2. Background Art

The insulated gate semiconductor device of the prior art will be explained hereinafter by referring to FIG. 5. This type of insulated gate semiconductor device is generally called a MOS transistor. Here, the MOS transistor with a high voltage structure will be explained. This kind of MOS transistor is used as an output buffer for an LCD driver.

In FIG. 5, an N− type source layer 52 and an N− type drain layer 53 are deeply formed by thermal diffusion on the surface of a P type silicon substrate 51. The N− type source layer 52 and the N− type drain layer 53 are made of an N type diffusion layer of a relatively low impurity concentration. The region between the N− type source layer 52 and the N− type drain layer 53 is a channel region CH.

Reference numerals 54 and 55 denote thick gate oxide films formed by selective oxidation. The thick gate oxide film 54 is formed at the edge of the N− type drain layer 53, and the thick gate oxide film 55 is formed at the edge of the N− type source layer 52. Reference numeral 56 denotes a field oxide film formed simultaneously by the selective oxidation stated above. The thick gate oxide films 54, 55, and the field oxide film 56 are films that are generally called LOCOS.

Reference numeral 57 denotes a thin gate oxide film formed on the channel region CH of the MOS transistor. The thin gate oxide film 57 and the thick gate oxide films 54 and 55 make a unitary unit forming a gate oxide film. N+ type source layer 58 is formed on the surface of the silicon substrate 51 between the thick oxide film 54 and the field oxide film 56. Likewise, N+ type drain layer 59 is formed on the surface of the silicon substrate 51 between the thick oxide film 55 and the field oxide film 56. The N+ type source layer 58 and the N+ type drain layer 59 are made of an N type diffusion layer of a high impurity concentration. A gate electrode 60 covers the thin gate oxide film 57 and partially extends over the thick gate oxide films 54 and 55.

The structure of the MOS transistor described above can be summarized as follows. The edge of the gate electrode 60 is formed away from the N+ type source layer 58 as well as away from the N+ type drain layer 59. The region between the gate electrode 60 and the N+ type source layer 58, and the region between the gate electrode 60 and the N+ type drain layer 59 are called offset regions. In the offset regions, the thick gate oxide films 54 and 55 are formed. Under these thick gate oxide films 54 and 55, the N− type source layer 52 and the N− type drain layer 53 are formed on the surface of the semiconductor substrate 51. The N− type source layer 52 and the N− type drain layer 53 also extend to the area beneath the N+ type source layer 58 and the N+ type drain layer 59.

The structure described above provides an improvement in the breakdown voltage between the gate and the source because of the smaller electric field between the gate electrode 60 and the N+ type source layer 58. In the same manner, the breakdown strength between the gate and the drain is also improved because of the smaller electric field between the gate electrode 60 and the N+ type drain layer 59. Here, the breakdown voltage between the gate and the source is the voltage at which dielectric breakdown occurs between the gate and the source when a high voltage is applied to the gate. Likewise, the breakdown voltage between the gate and the drain is the voltage at which dielectric breakdown occurs between the gate and the drain when a high voltage is applied to the gate.

Also, this structure provides an improvement in the source breakdown voltage, the drain breakdown voltage and the breakdown voltage between the source and the drain. Here, the source breakdown voltage is the voltage at which breakdown occurs when a high voltage is applied to the source. Also, the drain breakdown voltage is the voltage at which breakdown occurs when a high voltage is applied to the drain. The breakdown strength between the source and the drain is the voltage at which breakdown occurs when a high voltage is applied between the source and the drain.

However, in the structure described above, the height gap h1 between the gate electrode 60 and the N+ type source layer 58 or the N+ type drain layer 59 is large, because the gate electrode 60 partially extends over the thick gate oxide films 54 and 55.

Thus, the flatness of the interlayer oxide film 61 is reduced since the interlayer oxide film made of BPSG film reflects the height gap h1, creating the height gap H1. Here, BPSG stands for boron phosphorus silicate glass.

The reduction in the flatness of the interlayer oxide film 61 also causes problems such as degraded processing accuracy of a wiring layer which is formed on the interlayer oxide film 61. When an aluminum wiring layer is formed on the interlayer oxide film 61, an aluminum layer is first formed on the interlayer oxide film 61 by a sputtering method. Then, a photoresist layer is formed on the aluminum layer.

Next, the photoresist layer is exposed by using a stepper. A development processing is performed to the photoresist layer, and the photoresist layer is then processed to have a certain amount of line width. When the interlayer oxide film 61 becomes less flat, the accuracy of the line widths of the photoresist layer after the development processing is also degraded.

Afterwards, etching is performed on the aluminum layer by using the processed photoresist layer as a mask for forming the aluminum wiring layer. However, the degraded accuracy of the line widths of the photoresist layer also leads to degraded accuracy in the line widths of the aluminum wiring layer. That is, the deterioration of the flatness of the interlayer oxide film 61 causes the degraded processing accuracy of the wiring layer.

SUMMARY OF THE INVENTION

Therefore, this invention improves the flatness of the interlayer oxide film by minimizing the height gap between the gate electrode and the source layer as well the height gap between the gate electrode and the drain layer as much as possible.

The insulated gate semiconductor device of this invention include, but is not limited to, a first gate oxide film formed on a semiconductor substrate of a first conductivity type, a second gate oxide film adjacent to and thicker than the first gate oxide film, a gate electrode comprising a first silicon layer formed on the first gate oxide film and a second silicon layer superimposed on the first silicon layer and partially extending over the second gate oxide film, and source and drain layers of a second conductivity type formed away from the gate electrode.

In this configuration, since the part of the electrode extending over the second gate oxide film is made only of the second silicon layer, the thickness of this part of the gate electrode extending over the second gate oxide film can be small. Therefore, the height gap between the gate electrode and the source layer as well as the height gap between the gate electrode and the drain layer can be made smaller than in the prior art. Thus, the flatness of an interlayer oxide film which is formed on these layers and the electrode will be improved. On the other hand, since both the first and second silicon layers are superimposed on the first gate oxide films, it is possible to maintain an appropriate thickness of the gate electrode.

The manufacturing method of the insulated gate semiconductor device of this invention comprises forming a first gate oxide film on a semiconductor substrate of a first conductivity type, forming a first silicon layer and an oxidation protection film on top of the predetermined area of the first gate oxide film, forming a field oxidation film and a second gate oxide film through selective oxidation by using the oxidation protection film as a mask, forming a second silicon layer covering an entire area of a device intermediate after removing the oxidation protection film, forming a gate electrode which comprises the first silicon layer remaining on the first gate oxide film and the second silicon layer superimposed on the first silicon layer and extending over the second gate oxide film, and forming a source layer and drain layer of a second conductivity type away from the gate electrode.

In this manufacturing method, the first silicon layer functions as a pad silicon layer when the field oxide film and the second gate oxide film are formed by selective oxidation. The pad silicon layer is able to keep the LOCOS bird's beak small. Also, the pad silicon layer eases the stress caused by the selective oxidation, and thus prevents crystal defects from occurring in the semiconductor substrate. The manufacturing method of this invention keeps the first silicon layer intact and utilizes it as a part of the gate electrode. Also, since the part of the electrode extending over the second gate oxide film is made only of the second silicon layer, the thickness of this part of the gate electrode extending over the second gate oxide film can be small.

Therefore, the height gap between the gate electrode and the source layer as well as the height gap between the gate electrode and the drain layer can be made smaller as compared with the prior art. Therefore, the manufacturing method of this invention can minimize the height gap and shorten the manufacturing processing.

DETAILED DESCRIPTION OF THE INVENTION

Figure 1:
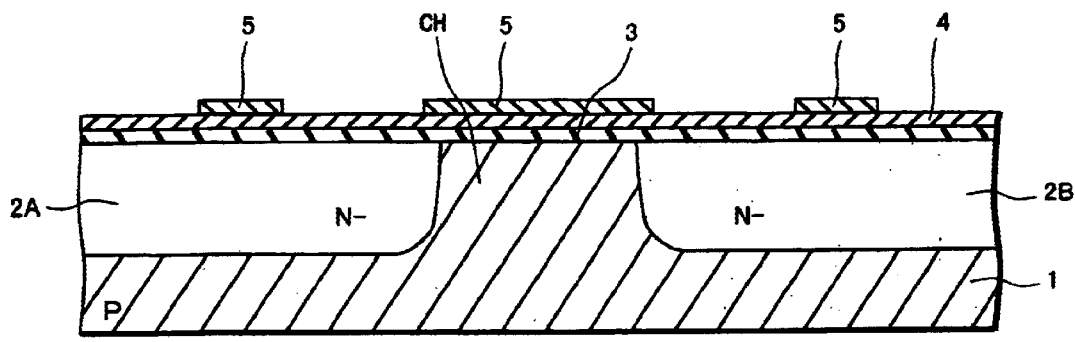
FIG. 1 is a cross-sectional view depicting a semiconductor device made by the manufacturing method of this invention.

The manufacturing method of the insulated gate semiconductor device as an illustrative embodiment of this invention will be explained hereinafter by referring to FIG. 1–FIG. 4. As seen in FIG. 1, on the surface of a P type silicon substrate 1 (the boron impurity concentration is about $1 \times 10^{15}/cm^2$), an N– type source layer 2A and an N– type drain layer 2B are formed through an ion implantation process and a diffusion process. The region between the N– type source layer 2A and the N– type drain layer 2B is a channel region CH. Here, the conditions of the ion implantation process and the diffusion process can be selected according to the targeted source breakdown voltage and drain breakdown voltage.

For example, when a breakdown voltage of 30V is targeted, phosphorus ions should be implanted at a dose of $1 \times 10^{13}/cm^2$, and then the thermal diffusion at about 1100° C. should be performed for several hours in a thermal processing furnace.

Next, on the P type silicon substrate 1, a first gate oxide film 3 (here, $SiO_2$) of a 10nm–15 nm thickness is formed by thermal oxidation. On this first gate oxide film 3, a first polysilicon layer 4 of a 50 nm–100 nm thickness and a silicon nitride film ($Si_3N_4$ film) 5 of a 50 nm–100 nm thickness are formed by LPCVD method. Then, dry etching is selectively performed on the silicon nitride film by using a photoresist, not shown in the figure, as a mask. The dry etching can be, for example, reactive ion etching using $CHF_3$ gas. Here, it is also possible to form an amorphous silicon layer in stead of the first polysilicon layer 4.

The silicon nitride film 5 is selectively formed on the regions where an N+ type source layer and an N+ type drain layer are to be formed afterwards and the channel region CH. Also, when the dry etching described above is performed, it is possible to use the photoresist as a mask and to perform the etching on the polysilicon layer 4.

Figure 2:
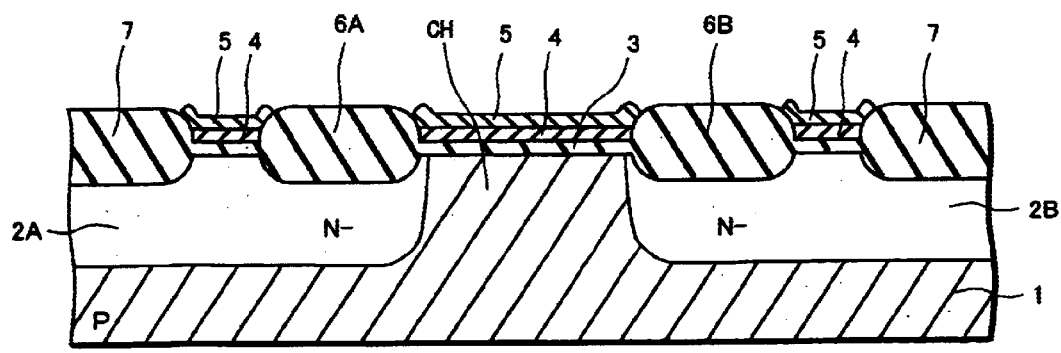
FIG. 2 is a cross-sectional view depicting a semiconductor device made by the manufacturing method of this invention at a point subsequent to FIG. 1.

Then, as shown in FIG. 2, thermal oxidation at about 1000° C. is performed for forming thick second gate oxide films 6A and 6B (here, an $SiO_2$ film) of about 500 nm thickness, and a field oxide film 7 is formed in the area where the silicon nitride film 5 is removed by etching.

Here, the silicon nitride film 5 works as an oxidation protection film. The first gate oxide film 3 is a film that is also called a pad oxide film, which prevents the occurrence of crystal defects in the P type silicon substrate 1 under the bird's beak of the field oxide film 7. The first polysilicon layer 4 is a layer that is also called a pad polysilicon layer, which shortens the bird's beak and also prevents the occurrence of crystal defects in the P type silicon substrate 1. Additionally, the first polysilicon layer 4 works as a part of the gate electrode afterwards. Here, it is desirable to keep the resistivity of the first polysilicon layer 4 low by the ion implantation of impurities such as boron or phosphorus into the polysilicon layer 4 before or after the field oxidation.

Figure 3:
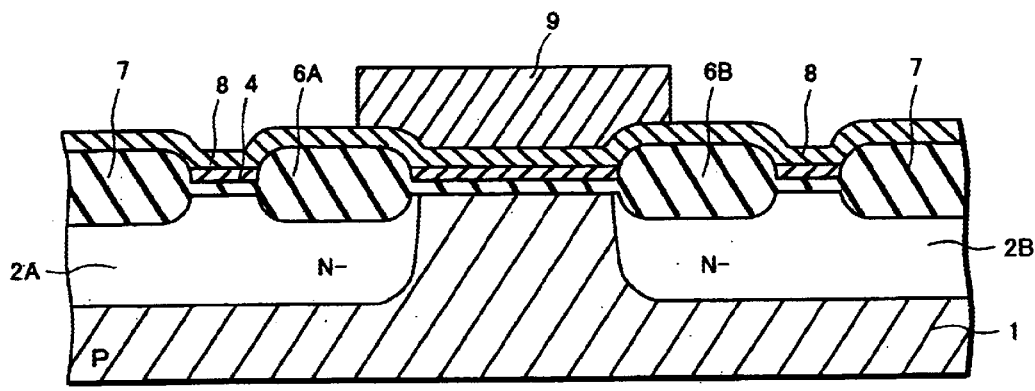
FIG. 3 is a cross-sectional view depicting a semiconductor device made by the manufacturing method of this invention at a point subsequent to FIG. 2.

Then, as shown in FIG. 3, after removing the silicon nitride film 5 using chemicals such as hot $POCl_3$, a second polysilicon layer 8 of 50 nm–100 nm thickness is deposited onto the whole surface by a LPCVD method. Since the second polysilicon layer 8 is used as a part of the gate electrode afterwards, the doping of impurities such as phosphorus is performed for keeping the resistivity low. Then, a photoresist is applied to the whole surface of the second polysilicon layer 8, which is then exposed by using a certain mask. The photoresist layer 9 covering the area where the gate electrode is to be formed is formed through development processing.

Figure 4:
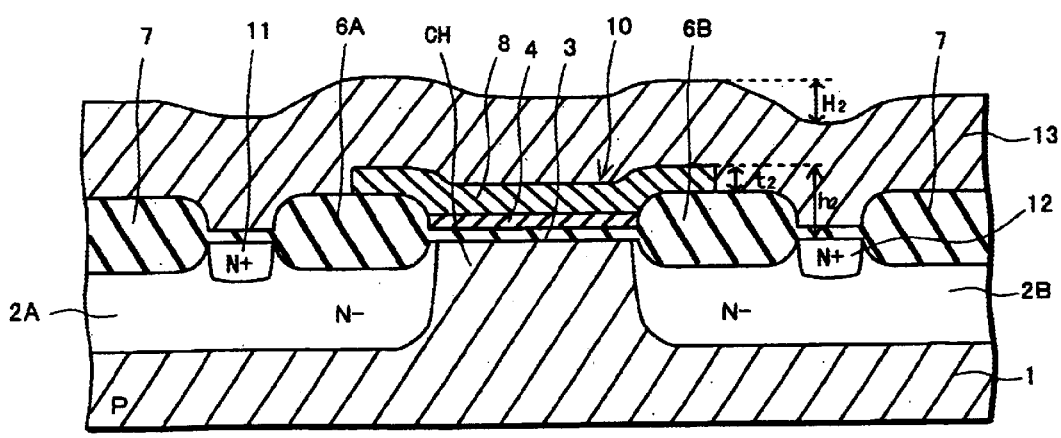
FIG. 4 is a cross-sectional view depicting a semiconductor device made by the manufacturing method of this invention at a point subsequent to FIG. 3.
Figure 5:
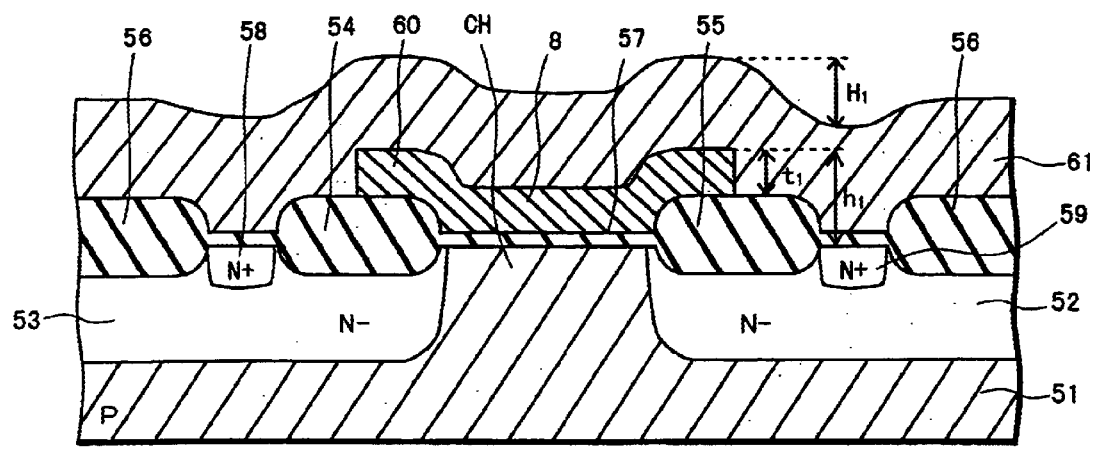
FIG. 5 is a cross-sectional view depicting the semiconductor device of the prior art.

Next, as shown in FIG. 4, by using the photoresist layer 9 as a mask, the second polysilicon layer 8 and the first polysilicon layer 4 are removed by etching. Through this process, the gate electrode 10 is formed. The gate electrode 10 comprises the first polysilicon layer 4 remaining on the first gate oxide film 3, the part of the second polysilicon layer 8 superimposed on the polysilicon layer 4, and the part of the second polysilicon layer 8 extending over the second gate oxide film 6A and 6B.

Then, by the ion implantation, the N+ type source layer 11 and the N+ type drain layer 12 are formed. Here, during the CMOS process, the region where P-channel type MOS transistor is to be formed is masked by the photoresist. Then, the ion implantation for forming the source and drain is performed. Although the conditions of the ion implantation can be selected accordingly, in general, arsenic ions are implanted at a dose of about $1 \times 10^{15}/cm^2$.

By this, the N+ type source layer 11 is formed in a self-aligned manner at the edge of the second gate oxide film 6A and the edge of the field oxide film 7. Likewise, the N+ type drain layer 12 is formed in a self-aligned manner at the edge of the second gate oxide film 6A and the edge of the field oxide film 7. That is, the N+ type source layer 11 is formed between the second gate oxide film 6A and the field oxide film 7, and the N+ type drain layer 12 is formed between the second gate oxide film 6B and the field oxide film 7.

In the insulated gate semiconductor device formed by the manufacturing method described above, that is, in the N-channel type high voltage MOS transistor, the edges of the gate electrode 10 are located away from the N+ type source layer 11 and the N+ type drain layer 12, and the thick second gate oxide films 6A and 6B are formed at the offset regions. Furthermore, under the thick second gate oxide films 6A and 6B, the N– type source layer 2A and the N– type drain layer 2B are formed on the silicon substrate 1. By this, the electric field between the gate electrode 10 and the N+ type source layer 11 as well as the electric field strength between the gate electrode 10 and the N+ type drain layer 12 are weakened. Thus, the breakdown voltage between the gate and the source and the breakdown voltage between the gate and the drain are improved.

On the first gate oxide film 3, the gate electrode 10 has a multi layered structure made of the first polysilicon film 4 and the second polysilicon layer 8 On the other hand, on the thick second gate oxide films 6A and 6B, the gate electrode 10 is a single layer of the second polysilicon layer 8. Thus, the thickness of the gate electrode 10 on the first gate oxide film 3 is the same as that of the gate electrode of the prior art, but the film thickness t2 of the gate electrode 10 on the second gate oxide films 6A and 6B is thinner than the thickness t1 of the prior art.

Therefore, the height gap h2 between the gate electrode 10 and the N+ type source layer 11 and the height gap h2 between the gate electrode 10 and the N+ type drain layer 12 become smaller compared to those of the prior art, leading to the improved flatness of the interlayer oxide film 13. That is, as shown in FIG. 4, the height gap H 2 of the interlayer oxide film is smaller than the height gap H1 of the prior art. Thus, as a result of the improved flatness of the interlayer oxide film 13, the processing accuracy for forming an Al wiring layer by photolithography processing on the interlayer oxide film 13 is also improved.

As explained above, the manufacturing method of the insulated gate semiconductor device of this invention can achieve higher breakdown strength and improved flatness of the interlayer oxide film 13 because of the smaller height gap between the gate electrode 10 and the N+ type source layer 11 and the smaller height gap between the gate electrode 10 and the N+ type drain layer 12 compared to the prior art. The disclosure herein of an illustrative embodiment of the invention does not limit the invention as disclosed and claimed herein, as the scope of the invention for which protection is sought is set forth in the appended claims and equivalents. Persons skilled in the art will recognize from this disclosure equivalent and alternative embodiments and ways of carrying out the invention.

What is claimed is:

1. An insulating gate semiconductor device comprising:
   a gate oxide film formed on a semiconductor substrate of a first conductivity type;
   a field oxide film formed adjacent to the gate oxide film and thicker than the gate oxide film;
   a gate electrode comprising a first silicon layer and a second silicon layer, the first silicon layer being electrically in contact with the second silicon layer, the first silicon layer being disposed only on the gate oxide film, the second silicon layer being (continuous on the first silicon layer and the field oxide layer) disposed on the first silicon layer and the field oxide layer and the second silicon layer being (disposed on the first silicon layer) continuous on the first silicon layer and the field oxide layer so that the total thickness of the first and second silicon layers above the gate oxide film is larger than a thickness of the second silicon layer on the field oxide layer; and
   source and drain layers of a second conductivity type formed below (away from) the gate electrode.

2. The insulated gate semiconductor device of claim 1, wherein the source and drain layers of the second conductivity type are formed away from an edge of the second silicon layer.

3. The insulated gate semiconductor device of claim 1, wherein the first silicon layer is a pad polysilicon layer.

4. The insulated gate semiconductor device of claim 1, wherein the source and drain layers of the second conductivity type are formed within low concentration source and drain layers of the second conductivity type.

5. The insulated gate semiconductor device of claim 1, 2, 3 or 4, wherein the first and second silicon layers comprise polysilicon or amorphous silicon.

6. The insulated gate semiconductor device of claim 1, wherein a thickness of the first silicon layer is between 50 nm and 100 nm, and the thickness of the second silicon layer is between 50 nm and 100 nm.

7. The insulated gate semiconductor device of claim 1, wherein the thickness of the second silicon layer is larger than a thickness of the first silicon layer.

\* \* \* \* \*